United States Patent [19]

Lacher

[11] 3,916,216

[45] Oct. 28, 1975

[54] DIGITAL LOGIC CIRCUIT HAVING INTERNAL COMPENSATION FOR SIGNAL DETERIORATION

[75] Inventor: William A. Lacher, Lansdale, Pa.

[73] Assignee: Burroughs Corporation, Detroit, Mich.

[22] Filed: Apr. 8, 1974

[21] Appl. No.: 458,845

[52] U.S. Cl. ................ 307/203; 307/215; 307/264; 307/299 A

[51] Int. Cl.² .................. H03K 19/00; H03K 19/22

[58] Field of Search ....... 307/218, 237, 264, 299 A, 307/203, 215, 214, 235 R

[56] References Cited

UNITED STATES PATENTS 3,351,782 11/1967 Narud et al. .................... 307/299 A

*Primary Examiner*—John Zazworsky
*Attorney, Agent, or Firm*—Manuel Quiogue; William B. Penn; Kevin R. Peterson

[57] ABSTRACT

A logic circuit including a multi-emitter input transistor for determining a logical function of input signals, a current amplifier for amplifying the logical function, an output amplifier for transferring the amplified logical function to succeeding logic stages, and internal level-shifting circuitry for preventing deterioration of the voltage level of the output of the logic circuit. The level-shifting circuitry includes elements for determining the input level necessary for initiating the level-shifting, a constant current sink and a current source.

12 Claims, 2 Drawing Figures

DIGITAL LOGIC CIRCUIT HAVING INTERNAL COMPENSATION FOR SIGNAL DETERIORATION

BACKGROUND OF THE INVENTION

This invention relates to a logic circuit for use as a basic building block in electrical circuits for performing binary operations and is well suited for integrated circuit fabrication.

Many types of basic logic circuits are available in integrated circuit form, including emitter-coupled logic (ECL), direct-coupled transistor logic (DCTL), diode-transistor logic (DTL), transistor-transistor logic (TTL), resistor-transistor logic (RTL), and complementary-transistor logic (CTL). To perform complex logical operations such as those required by a digital computer, basic logic circuits are connected in long circuit chains. The length and complexity of such circuit chains make it desirable that each logic circuit have certain features such as high speed, high noise immunity, wide operating temperature range, low power dissipation, low noise generation, and low cost. Furthermore, it is necessary that the binary signal not deteriorate or attenuate as it propagates through the chain.

Selection from the various types of basic logic circuits requires consideration of the advantages and disadvantages of the various logic circuits. Some of the disadvantages displayed by some types include high propagation time, low noise immunity, high power dissipation, slowdown with capacitive loading, extreme temperature sensitivity, lack of a wired-OR capability and signal attenuation.

CTL logic provides high speed, low power dissipation, a positive AND function, and wired-OR capability. However, a CTL gate has a tendency to oscillate under certain system configurations and it attenuates the logic signal. Furthermore, a CTL gate allows logic spikes to appear at the output and requires transistors of both conductivity types.

The present invention is designed to replace CTL gates and avoid their disadvantages.

It is, therefore, an object of this invention to improve logic circuits for performing a positive AND function and having a wired-OR capability.

It is a further object to provide a logic gate which is stable and does not attenuate the logic signal.

Another object of the invention is to provide a logic gate which has high noise immunity and does not allow a signal to appear at the output as long as at least one input remains low.

It is also an object of the invention to provide a logic gate which requires transistors of only one conductivity type.

SUMMARY OF THE INVENTION

The logic gate of the present invention includes a multi-emitter input transistor for determining a logical function result at its collector, a current amplifier connected to the collector, an output amplifier, and input-controlled level-shifting circuitry. The level-shifting circuitry changes the relationship between the output and the inputs of the gate in response to a predetermined input level for preventing output signal deterioration. As the input levels increase, the output also increases but remains below the input levels; but when a predetermined input level is reached, the level-shifting circuitry allows the output to increase at a faster rate than the inputs so that the output rises above the input levels. The output continues to increase with the continuing increase of the inputs and substantially remains above the input levels.

The level-shifting circuitry determines the input level necessary for allowing the output to increase at a greater rate and also provides the current for the internal level-shifting necessary for the required output when the predetermined input level is exceeded. The circuitry includes a constant current sink, a current source, fixed voltage references for determining the input level necessary to begin the level-shifting, and a switching element responsive to the predetermined input level.

BRIEF DESCRIPTION OF THE DRAWINGS

The various objects, advantages and features of the present invention will become more apparent to one skilled in the art from the following detailed description, appended claims and accompanying drawings in which:

DETAILED DESCRIPTION OF THE PREFERRED EMBODIMENT

Figure 1:
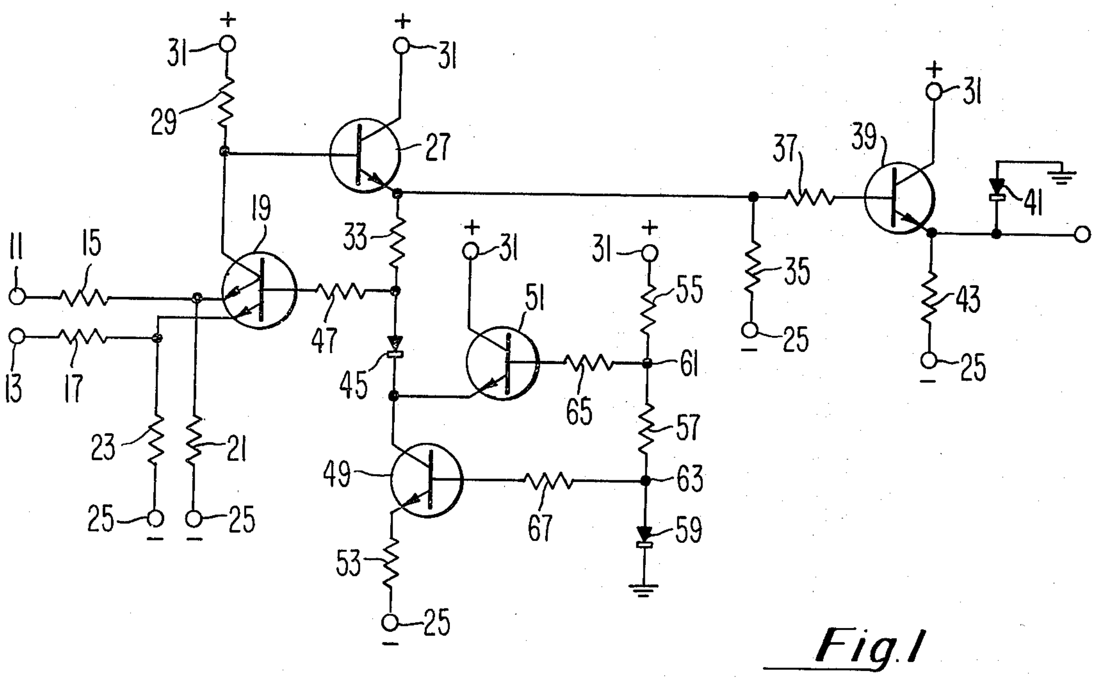
FIG. 1 is a circuit diagram of the preferred embodiment of the logic gate of the present invention.

Inputs to the logic circuit of the invention are applied to a pair of terminals 11, 13 which are connected to respective input resistors 15, 17. Each of the input resistors 15, 17 is connected to a respective emitter terminal of a multi-emitter input transistor 19. A pair of resistors 21, 23 connect the emitter terminals of multi-emitter transistor 19 to a source of constant negative potential 25. The input resistors 15, 17 tend to damp oscillations at the input of the logic circuit and also form voltage dividers with the negative potential resistors 21, 23. The voltage dividers at the input of the logic circuit shift the inputs to the emitters of multi-emitter transistor 19 to levels below the inputs to the logic circuit for achieving greater noise immunity and for preventing spurious signals from affecting the circuit. A logical AND function result of the inputs appears at the collector terminal of multi-emitter transistor 19.

The above description of the input circuit of the logic circuit of the invention and the accompanying FIG. 1 of the drawing indicate the use of a multi-emitter transistor 19 having only two emitters. However, such a limitation on the number of inputs is merely for purposes of illustration and ease of description. The use of a multi-emitter transistor having a greater number of emitters will be apparent to those skilled in the art.

Connected to the collector of the multi-emitter transistor 19 is the base terminal of a current-amplifier transistor 27 which operates as an emitter-follower. A resistor 29 connects the collector of multi-emitter transistor 19 to a source of constant positive potential 31. Resistor 29 allows the input to the base of the current-amplifier transistor 27 to swing with the current through resistor 29 and is also a current-limiting resistor. The collector of the current-amplifier transistor 27 is biased by the constant positive potential source 31.

A resistor 35 is connected between the emitter of current-amplifier transistor 27 and a source of constant negative potential 25 and a resistor 37 is connected between the emitter of this transistor and the base of an output transistor 39. Output transistor 39 has its collector biased by the constant positive potential source 31 and has its emitter clamped by a diode 41. A current-limiting resistor 43 is also connected from the emitter of the output transistor 39 to the constant negative potential source 25. The output of the logic circuit is obtained at the emitter of the output transistor 39.

A resistor 33 is connected between the emitter of the current-amplifier transistor 27 and the anode of a diode 45. A base resistor 47 has one terminal connected to the base of the multi-emitter transistor 19 and its other terminal connected to the anode of the diode 45. The cathode of diode 45 is connected to the collector of a transistor 49 and the emitter of a transistor 51. Transistor 49 operates as a current sink for drawing current through diode 45 and resistor 33. Transistor 51 operates as a current source when the diode 45 is nonconducting. A resistor 53, connected between the emitter of the current sink transistor 49 and the constant negative potential source 25, limits the current through this transistor and hence the current through resistor 33, when the diode 45 is conducting.

Resistors 55 and 57 and a diode 59 are connected in series between the source of constant positive potential 31 connected to one terminal of resistor 55 and the ground potential at the cathode of diode 59. Constant voltage references are thus formed at a node 61 between resistors 55 and 57 and at a node 63 between resistor 57 and diode 59. A base resistor 65 is connected between voltage reference node 61 and the base of the current source transistor 51; and a base resistor 67 is connected between voltage reference node 63 and the base of the current sink transistor 49. The constant voltage references at nodes 61 and 63 and resistor 53 bias transistor 49 as a constant current sink.

OPERATION OF THE INVENTION

Inputs to the logic gate are applied to the voltage dividers formed by resistor pairs 15 and 21, and 17 and 23. Input resistors 15 and 17 also suppress oscillations at the input. Each voltage divider network transfers a voltage signal to its respective emitter of multi-emitter transistor 19 which is at a level less than the input level. Furthermore, an increasing input signal to the logic circuit results in an increasing signal to an emitter of multi-emitter transistor 19 which increases at a smaller rate because of the voltage divider network at the input. This result is desirable for suppressing noise and for preventing spurious signals from affecting the logic gate.

As long as at least one input to the logic circuit remains at a low level, current will continue to flow through resistor 29 into the collector of multi-emitter transistor 19, resulting in a low input at the base of the current-amplifying transistor 27. Thus, the voltage level at the emitter of the transistor 27 is low and output transistor 39 is turned off. It is apparent that a low level signal at the input to the logic circuit prevents the occurrence of a high signal at the output of the logic circuit.

As all of the inputs to the logic circuit start to go high, the current through resistor 29 decreases, thus raising the voltage at the base terminal of the current-amplifying transistor 27 and turning it on. At the same time, the voltage at the base of multi-emitter transistor 19 also increases and remains above the lowest of any of the emitter voltages of multi-emitter transistor 19. Base resistor 47 conducts a negligible amount of current and the voltage at the anode of the diode 45 also increases.

The voltage level at the emitter of the current-amplifying transistor 27 follows the voltage at the base of this transistor and is offset by the diode voltage drop across the base-emitter junction. Diode 45 remains non-conducting until the voltage at its anode reaches a level which is one diode voltage drop above the voltage level at its cathode which is established by fixed voltage reference 61 and the diode drop across the base-emitter junction of current source transistor 51. Thus, essentially zero current is flowing through resistor 33 when none of the voltages at the emitters of multi-emitter transistor 19 exceeds a predetermined level with the result that the voltages at the anode of diode 45 and the emitter of transistor 27 are substantially the same.

As all inputs to the logic circuit continue to increase, the voltages at the base of multi-emitter transistor 19 and at the base of transistor 27 also increase. Since the voltage at any of the emitters of multi-emitter transistor 19 is a function of its corresponding voltage at the input to the logic circuit, the input to the logic circuit having the lowest voltage level of all inputs to the circuit is the controlling signal and current will flow through resistor 33 after this input of lowest voltage level reaches a level which establishes the required voltage at an emitter of multi-emitter transistor 19. Current flow through resistor 33 allows the emitter of transistor 27 to attain a voltage level higher than the voltage at the anode of diode 45.

The input level to the logic circuit necessary to allow diode 45 to conduct is determined by the voltage level at the cathode of diode 45 and by the relationship between the signal levels at inputs 11 and 13 and the voltage level at the anode of diode 45. Constant voltage references at nodes 61 and 63 are chosen such that the voltage at the cathode of diode 45 remains at a predetermined reference voltage and both transistors 49 and 51 are conducting when diode 45 is nonconducting.

Base resistor 65 conducts negligible current and the predetermined reference voltage is approximately one diode voltage drop below the constant voltage reference at node 61. Since base resistor 47 conducts negligible current, the voltage at the anode of diode 45 is substantially one diode voltage drop above the lowest emitter voltage of multi-emitter transistor 19. The voltages at the emitters of multi-emitter transistor 19 are determined by the values of the voltage divider resistors 15 and 21, and 17 and 23 at the inputs to the circuit. Therefore, the input voltage dividers determine the relation between the inputs to the logic circuit and the voltage of the anode of diode 45. It is readily apparent that the input level to the logic circuit necessary to turn on diode 45 is determined by the values of resistors 55 and 57 which establish constant voltage references at nodes 61 and 63 and by the values of the input voltage divider resistor pairs 15 and 21, 17 and 23.

Once the input to the logic circuit of lowest voltage level reaches the predetermined level, diode 45 begins to conduct and its anode voltage also continues to increase with this increasing input. As the voltage at the anode of diode 45 continues to increase, the current through resistor 33 also increases; and since diode 45 is now conducting, the voltage at its cathode also increases. The increasing voltage at the cathode tends to turn off transistor 51 and consequently transistor 49 eventually draws all of its current through resistor 33. Thus, the voltage across resistor 33 increases, thereby allowing the emitter voltage of transistor 27 to increase above the voltage at the anode of diode 45. A maximum current is reached because transistor 49 is a constant current sink and a maximum voltage drop across resistor 33 is also reached.

Therefore, it can be seen that the voltage at the emitter of current-amplifying transistor 27 remains close to the voltage at the base of multi-emitter transistor 19 until the input to the logic circuit of lowest voltage level sufficiently raises the voltage level at the base of multi-emitter transistor 19 to allow diode 45 to start conducting. Current flow in resistor 33 allows the emitter of current-amplifying transistor 27 to reach a higher voltage. This level shifting at the emitter of current-amplifying transistor 27 prevents deterioration of the output signal of the logic circuit, and eliminates the necessity of buffers between logic stages.

The output signal of current-amplifying transistor 27 is transferred through base resistor 37 to output transistor 39 which supplies a current gain to the logic circuit output. The output of the logic circuit is obtained at the emitter of transistor 39 and the low end of the output swing is clamped by the diode 41. The high end of the swing of the logic circuit output is essentially determined by the voltage drop across resistor 29, the diode voltage drops across the base-emitter junctions of transistors 27 and 39 and the load impedance.

Since the output of the logic circuit is from the emitter of output transistor 39, a plurality of outputs from several logic circuits of the present invention may be connected together to determine an OR function result of the plurality of outputs. This wired-OR capability reduces the number of gates required to perform a given binary operation.

Figure 2:
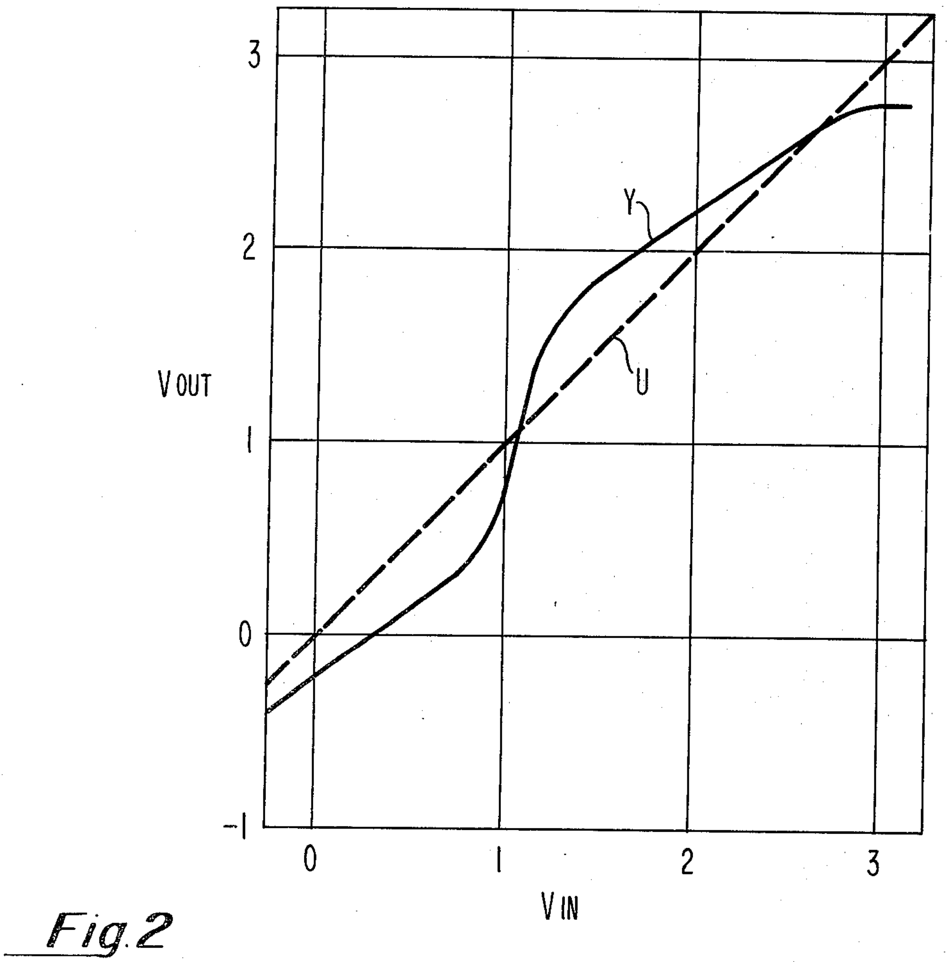
FIG. 2 is a graph of the transfer characteristic of the logic gate of FIG. 1.

FIG. 2 illustrates a typical transfer characteristic of the logic circuit of the present invention. The solid line Y represents the actual transfer characteristic of the logic circuit and dashed line U represents a hypothetical transfer characteristic of unity gain. $V_{in}$ is the input signal to the logic circuit of lowest voltage level and $V_{out}$ is the signal at the output of the logic circuit which is obtained at the emitter of output transistor 39. As can be seen from FIG. 2, the output of the logic circuit initially remains below the input signal to the logic circuit of lowest voltage level as the input signal increases. When a predetermined input level is reached, the output signal of the logic circuit increases at a greater rate than the input signal of the lowest voltage level and reaches a level which is significantly higher than the input level of lowest voltage level. After the output of the circuit reaches a certain level its rate of increase decreases and its value approaches the input signal.

What is claimed is:

1. A logic circuit for acting on a plurality of input signals and for preventing deterioration of an output signal therefrom comprising:

input means for providing a logical function signal in response to said plurality of input signals;

output means responsive to said logical function signal for generating the output signal of the logic circuit; and means for shifting the voltage level of said logical function signal when a predetermined voltage level is exceeded by all the input signals and for establishing the predetermined voltage level.

2. The logic circuit of claim 1 wherein said level-shifting means comprises:

a constant current sink;

voltage sensitive switching means for passing current to said constant current sink when said predetermined voltage level is exceeded by all the input signals;

means for establishing a voltage reference which determines said predetermined voltage level and for supplying current to said constant current sink when said switching means is not passing sufficient current; and impedance means responsive to the flow of current through said switching means for raising the voltage level of said logical function signal.

3. The logic circuit of claim 2 wherein said voltage sensitive switching means comprises:

a diode having a first terminal connected to said constant current sink and a second terminal connected to said impedance means; and a resistor connected between said second terminal and said input means for sensing one of said inputs.

4. The logic circuit of claim 3 wherein said voltage reference establishing and current supplying means comprises:

means for providing a plurality of constant voltage reference nodes; and a transistor having its base connected to one of said constant voltage reference nodes and having its emitter connected to said first terminal of said diode.

5. A logic circuit for acting on a plurality of input signals and for preventing deterioration of an output signal therefrom comprising:

input means for providing a first signal as a logical function result of said plurality of input signals and for generating a second signal having a voltage level determined by the input signal of lowest voltage level;

means responsive to said first signal for generating a third signal by current amplification of said first signal;

means for generating the output signal of the logic circuit by further current amplification of said third signal;

means for preventing said output signal from going below a fixed voltage; and means for shifting the voltage level of said third signal when a predetermined voltage level is exceeded by said second signal and for establishing the predetermined voltage level.

6. The logic circuit of claim 5 wherein said level-shifting means comprises:

a constant current sink;

voltage sensitive switching means for passing current to said constant current sink when said predetermined voltage level is exceeded by said second signal;

means for establishing a voltage reference which determines said predetermined voltage level and for supplying current to said constant current sink when said switching means is not passing sufficient current to said constant current sink; and a level-shifting resistor connected between the output of said current amplifying means and said switching means for producing a potential difference to raise the voltage level of said third signal when said voltage sensitive switching means is conducting.

7. The logic circuit of claim 6 wherein said voltage sensitive switching means comprises:

a diode having its first terminal connected to said constant current sink and its second terminal connected to said level-shifting resistor; and a base resistor connected between said second terminal and said input means for sensing said second signal.

8. The logic circuit of claim 7 wherein said voltage reference establishing and current supplying means comprises:

means for providing a plurality of constant voltage reference nodes; and a transistor having its base connected to one of said constant voltage reference nodes and having its emitter connected to said first terminal of said diode.

9. A logic circuit for acting on a plurality of input signals and for preventing deterioration of an output signal therefrom comprising:

means for reducing the voltage levels of said input signals and for damping oscillations in said input signals;

a multi-emitter transistor for accepting the reduced input signals at its emitters;

a first transistor having its base connected to the collector of said multi-emitter transistor;

a second transistor for generating the output of the logic circuit at its emitter;

a resistor connected between the emitter of said first transistor and the base of said second transistor;

a diode clamp at the emitter of said second transistor; and means for shifting the voltage level at the emitter of said first transistor when a predetermined voltage level is exceeded by the voltage level at the base of said multi-emitter transistor.

10. The logic circuit of claim 9 wherein said level-shifting means comprises:

a constant current sink;

voltage sensitive switching means for passing current to said constant current sink when said predetermined voltage level is exceeded by the voltage level at the base of said multi-emitter transistor;

a current source for supplying current to said constant current sink when said voltage sensitive switching means is not passing sufficient current and for establishing a voltage reference which determines said predetermined voltage level; and a level-shifting resistor connected between said voltage sensitive switching means and the emitter of said first transistor for producing a potential difference to raise the voltage level at the emitter of said first transistor when said switching means is conducting.

11. The logic circuit of claim 10 wherein said voltage sensitive switching means comprises:

a diode having a first terminal connected to said constant current sink and a second terminal connected to said level-shifting resistor; and a base resistor connected between said second terminal of said diode and the base of said multi-emitter transistor for sensing the voltage level at the base of said multi-emitter transistor.

12. The logic gate of claim 11 wherein said current source comprises:

a third transistor having its emitter connected to said first terminal of said diode; and a plurality of constant voltage reference nodes individually connected to said constant current sink and to the base of said third transistor for establishing said voltage reference at said first terminal of said diode.

* * * * *